US011597861B2

(12) United States Patent
Yu et al.

(10) Patent No.: US 11,597,861 B2
(45) Date of Patent: Mar. 7, 2023

(54) POLYMER COMPOSITES WITH HIGHLY TUNABLE THERMAL AND MECHANICAL PROPERTIES AND METHODS OF MANUFACTURE

(71) Applicant: The Texas A&M University System, College Station, TX (US)

(72) Inventors: Choongho Yu, College Station, TX (US); Hong Wang, College Station, TX (US); Gang Yang, College Station, TX (US)

(73) Assignee: The Texas A&M University System, College Station, TX (US)

( * ) Notice: Subject to any disclaimer, the term of this patent is extended or adjusted under 35 U.S.C. 154(b) by 262 days.

(21) Appl. No.: 17/142,032

(22) Filed: Jan. 5, 2021

(65) Prior Publication Data
US 2021/0147740 A1    May 20, 2021

Related U.S. Application Data

(63) Continuation of application No. 16/091,889, filed as application No. PCT/US2017/026709 on Apr. 7, 2017, now abandoned.
(Continued)

(51) Int. Cl.
*C09K 5/14* (2006.01)
*F28F 21/02* (2006.01)
(Continued)

(52) U.S. Cl.
CPC ............ *C09K 5/14* (2013.01); *C01B 32/158* (2017.08); *C01B 32/168* (2017.08); *C08J 5/005* (2013.01);
(Continued)

(58) Field of Classification Search
None
See application file for complete search history.

(56) References Cited

U.S. PATENT DOCUMENTS 7,105,596 B2    9/2006   Smalley et al.
7,304,103 B2    12/2007  Tour et al.
(Continued)

FOREIGN PATENT DOCUMENTS

WO    WO-2004053464 A1 *  6/2004  ............ B82Y 15/00
WO    WO-2007140469 A2 *  12/2007 ............... C08K 3/01

OTHER PUBLICATIONS

Wang et al.; "Highly deformable thermal interface materials enabled by covalently-bonded carbon nanotubes"; Carbon; vol. 106; May 7, 2016; pp. 152-157; abstract.
(Continued)

*Primary Examiner* — Robert S Loewe
(74) *Attorney, Agent, or Firm* — Winstead PC (57) ABSTRACT

A method of forming an polymer composites is disclosed herein that includes infiltrating CNT sponges with a polymer or metal to form a composite. The method uses a relatively easy, scalable, and low-cost synthesis process that makes the composites attractive as TIM. CNTs in the sponge structure are covalently bonded, resulting in a low Young's modulus while at the same time maintaining a good thermal conductivity. This strategy makes it possible to obtain both high deformability and high thermal conductivity, which are difficult to have simultaneously due to their adverse correlation.

17 Claims, 5 Drawing Sheets

Related U.S. Application Data (60) Provisional application No. 62/319,722, filed on Apr. 7, 2016.

(51) Int. Cl.

| | | |
|---|---|---|
| *H01L 23/373* | (2006.01) | |
| *C01B 32/158* | (2017.01) | |
| *C08K 3/04* | (2006.01) | |
| *C08J 5/00* | (2006.01) | |
| *C01B 32/168* | (2017.01) | |
| *C22C 32/00* | (2006.01) | |
| *C23C 16/26* | (2006.01) | |
| *F28F 21/06* | (2006.01) | |
| *F28F 21/08* | (2006.01) | |
| *H01L 23/433* | (2006.01) | |
| *B82Y 30/00* | (2011.01) | |
| *B82Y 40/00* | (2011.01) | |

(52) U.S. Cl.
CPC .......... *C08K 3/041* (2017.05); *C22C 32/0084* (2013.01); *C23C 16/26* (2013.01); *F28F 21/02* (2013.01); *F28F 21/06* (2013.01); *H01L 23/373* (2013.01); *H01L 23/3733* (2013.01); *H01L 23/3737* (2013.01); *B82Y 30/00* (2013.01); *B82Y 40/00* (2013.01); *C01B 2202/24* (2013.01); *C08J 2383/04* (2013.01); *F28F 21/08* (2013.01); *F28F 2255/06* (2013.01); *H01L 23/433* (2013.01)

(56) References Cited

U.S. PATENT DOCUMENTS

| | | |
|---|---|---|
| 7,838,587 B2 | 11/2010 | El Bounia et al. |
| 8,702,897 B2 | 4/2014 | Lin et al. |
| 9,024,436 B2 | 5/2015 | Zhao et al. |
| 2004/0222080 A1 | 11/2004 | Tour et al. |
| 2009/0257796 A1* | 10/2009 | Colvin ............... G03G 15/2007 399/336 |
| 2011/0224376 A1 | 9/2011 | Zhai et al. |
| 2012/0238021 A1 | 9/2012 | Hashim et al. |
| 2013/0101495 A1* | 4/2013 | Peterson .................. C08K 3/04 423/447.2 |
| 2014/0011969 A1 | 1/2014 | Panchapakesan |
| 2014/0127490 A1 | 5/2014 | Islam et al. |
| 2014/0345843 A1 | 11/2014 | Kirkor et al. |
| 2015/0210811 A1* | 7/2015 | Hong ..................... B82Y 40/00 523/435 |
| 2015/0225242 A1 | 8/2015 | Noyes |

OTHER PUBLICATIONS

Murali, Adhigan et al.; "Augmentation of properties on sparingly loaded nanocomposites via functionalized single-walled carbon nanotubes using a covalent approach"; The Royal Society of Chemistry; No. 4; 2014; pp. 62947-62950.

Mandal, Amit et al.; "Ionic Liquid Integrated Multiwalled Carbon Nanotube in a Poly(vinylidene fluoride) Matrix: Formation of a Piezoelectric β-Polymorph with Significant Reinforcement and Conductivity Improvement"; ACS Applied Materials & Interfaces; No. 5; 2013; pp. 747-760.

Fu, Yifeng et al.; "Templated Growth of Covalently Bonded Three-Dimensional Carbon Nanotube Networks Originated from Graphene"; Advanced Materials; No. 24; 2012; pp. 1576-1581.

Khare, Ketan S. et al.; "Effect of Carbon Nanotube Functionalization on Mechanical and Thermal Properties of Cross-Linked Epoxy-Carbon Nanotube Nanocomposites: Role of Strengthening the Interfacial Interactions"; ACS Applied Materials & Interfaces; No. 6; 2014; pp. 6098-6110.

Shanmugharaj, A.M. et al; "Physical properties of phenol-anchored multiwall carbon nanotube/epoxy nanocomposite"; Polym. Bull.; No. 67; 2011; pp. 1721-1730.

\* cited by examiner

POLYMER COMPOSITES WITH HIGHLY TUNABLE THERMAL AND MECHANICAL PROPERTIES AND METHODS OF MANUFACTURE

CROSS-REFERENCE TO RELATED APPLICATION(S)

This application is a continuation of application Ser. No. 16/091,889 filed Oct. 5, 2018, which is a national stage application under 35 U.S.C. § 371 of PCT/US2017/026709 filed Apr. 7, 2017, which claims the benefit under 35 U.S.C. § 119(e) of U.S. Provisional Patent Application No. 62/319,722, filed Apr. 7, 2016, all of which are incorporated herein by reference in their entirety as if fully set forth herein.

BACKGROUND

Polymer composites are very popular choices when particular functionalities are necessary in the polymers. In general the purpose of using the additive is to either increase or decrease a particular property value of the composites rather than make the property widely tunable. The key shortcomings of the current state-of-the-art in manufacturing of polymer composites typically require long-term curing/cooling processes in ovens low thermal conductivity through the thickness, which has a large amount of wasted heat emission to the environment. In order to assure that the part cures uniformly, it must be heated from the outside at a slow rate to assure that cure reaction is uniform at a safe, slow rate throughout the structure. The slow process is even more important for lightweight porous composites due to low and non-uniform thermal conductivity. Even after the part is fully cured, energy and time are required to slowly cool the material uniformly throughout the structure to avoid high residual stress.

An exemplary application of the polymer composites is a thermal interface material (TIM), which is widely used to effectively transfer thermal energy from power consuming devices to heat sinks. Therefore a high thermal conductivity is necessary. On the other hand, a very low thermal conductivity close to that of ambient air can be achieved using polymer composites. This type of material is often called aerogel.

The key material is carbon nanotube which is formed into three dimensional structures while they are growing. When polymers are combined, this material can have thermal conductivity much higher or much lower than that of typical polymers. The composites can be fabricated using a facile microwave assisted manufacturing method, which can greatly reduce manufacturing time and cost as well as thermal stress.

As for TIM, when two rigid materials are in contact, voids created by surface asperity cause poor heat transfer. Such inefficient heat transfer from heat sources to heat sinks has been a well-known crucial issue in thermal management, which now becomes much more important due to highly integrated modern devices. Recent performance improvements in the thermal conductivity of TIM have made it possible to increase the effectiveness of popular commercial TIMs, which have thermal conductivities of about 0.4 W/m-K. In comparison, carbon nanotubes (CNTs) can have thermal conductivities of around 10 W/m-K. The exceptional thermal conductivity of individual CNTs have rarely materialized in bulk materials mainly due to the large thermal contact resistance between carbon nanotubes. This can be attributed to weak van der Waals bonding at the CNT junctions where the outstanding phonon transport along the strong covalent bonding on the graphitic layer is largely impeded. In bulk materials, however, it has been extremely difficult to achieve covalently bonded junctions between CNTs.

A common strategy to make TIM is to add tillers of high thermal conductivity to a polymer matrix. CNTs are a popular filler material owing to their high thermal conductivity of around 10 W/m-K for "individual" CNTs. Nevertheless, CNT-polymer composites often have thermal conductivities lower than 1 W/m-K. Even with high CNT concentrations, thermal conductivity remains relatively low because the macroscopic thermal conduction in CNT-filled polymer composites is governed by the thermal contact resistance of interfaces at CNT-CNT junctions rather than the intrinsic thermal conductivity of individual CNTs. This poor thermal conduction can be ascribed to weak van der Waals interactions at CNT-CNT junctions. Covalently-bonded junctions in CNT networks are expected to improve heat transport at the CNT-CNT junction. However, this has been only feasible theoretically or experimentally for a single junction at a time using electron beams, which is hard to be utilized in practically viable bulk composites.

Due to the difficulty of strengthening the bonding at CNT junctions, there have been efforts to make vertically aligned CNTs to increase the thermal conductivity of CNT-polymer composites along the axial direction of CNTs. For instance, an aligned CNT-epoxy composite having a thermal conductivity of 1.4 W/m-K at room temperature has been prepared using a microwave-assisted method. Higher thermal conductivity up to 4.9 W/m-K was reported for CNT-polymer composites with densely-packed, aligned CNTs. However, these aligned CNTs often suffer from low deformability, making poor thermal contacts with heat sinks/sources. The alignment of CNTs also requires significant efforts, which may not be suitable for a scale-up process. Other fillers such as graphene, ceramics, and metals have also been studied, but heat flow in these materials is still limited by the thermal contact resistance between the fillers. High concentrations of inorganic fillers make composites unmalleable and brittle. The thermal conductivity of graphene is preferentially high along the in-plane direction, so significant efforts are required to orient the graphene plane along the thickness direction of TIM. Graphene also requires long processing time for dispersion and purification/centrifugation. To date, elastomeric TIMs with scalability and decent thermal conductivity are not practically available.

Aerogel is a three-dimensional highly porous material whose extraordinary properties are extremely low thermal conductivity, large surface areas, high porosity, and low density, so potential applications are numerous including thermal insulation, the electrodes of electrochemical cells, sensors/actuators, and biotechnology. The most outstanding characteristic of traditional aerogels made of silica is the low thermal conductivity, ~0.03 W/m-K, which is close to that of ambient air. However, silica-based aerogels easily collapse when they are under even light mechanical pressure or environments with hydrophilic liquids (e.g., water) or high humidity.

Recently, various aerogels have been synthesized using metal oxides, polymers, and carbonaceous materials rather than silica due to the demand for more functionalities such as electrical conduction, compressibility, and resilience under mechanical stress. In particular, aerogels made of CNTs or/and graphene have extended their usage to electrochemical cells such as supercapacitors, batteries, and fuel cells owing to the good electrical conductivity and high surface areas and porosity. Nevertheless, like typical aerogels, the drawbacks in mechanical properties such as fragility and poor resilience have largely restricted the wide utilization of aerogels.

The poor mechanical properties mainly come from weak bonding between CNTs or/and graphene despite the extraordinary mechanical strength of individual CNTs. Therefore, many attempts to strengthen the connection have been made. For example, uncured polymers such as poly(vinyl alcohol), epoxy, and cellulose, polydimethylsiloxane (PDMS) were infiltrated into porous CNT or/and graphene structure, and then polymers were cured, this type of methods make the bonding at the connection stronger, but the pores of the aerogels are also filled up with the polymer, negating the benefit of aerogels.

SUMMARY OF THE INVENTION

A new type of composite, elastomeric TIM is disclosed. A method of forming the elastomeric TIM includes infiltrating metals or polymers into CNT sponges using an easy, scalable, and low-cost synthesis process, which makes the composites attractive as TIM. CNTs in the sponge structure are covalently bonded, resulting in a low Young's modulus while at the same time maintaining a good thermal conductivity. Further study to control density of covalently bonded CNT junctions may provide improved conditions for desired thermal and mechanical properties. This strategy makes it possible to obtain both high deformability and high thermal conductivity, which are difficult to have simultaneously due to their adverse correlation.

A composition for a thermally deformable interface material comprised of covalently-bonded polymer carbon nanotube (CNT) composites includes covalent bonds between junctions of sponge-like CNT structures, which yields a high thermal conductivity and low Young's modulus. These unique properties allow the material to deform and cover a surface. In various embodiments, this would allow two surfaces to come into full/improved contact for improved transfer of heat between the surfaces.

Super resilient CNT-polymer composite aerogels with ultra-low thermal conductivity and high electrical properties were designed and fabricated using the facile and quick microwave-assisted process for the scalable production. Nanometer-thickness polymer layers were coated on the surface of CNT in the sponge structure without unwanted filling of the voids with the polymers. The aerogels show high compressibility, thermal insulation and elasticity-dependent electric conduction, suggesting its use as promising high mechanical properties with shows ultra-low thermal conductivity and high electrical conductivity in a wide range of real-world applications.

A method of manufacturing CNT-polymer composites includes dispensing CNT-containing liquid-phase polymer (slurry) with desired concentration/size of hollow cylinders at a loading area of a conveyor. The addition of the hollow cylinders makes the composite lightweight. When the hollow cylinders are oriented along the desired direction, the mechanical properties of the composites are not sacrificed. The slurry is then conveyed by one or more rollers to a pulse-microwave radiation location where the slurry is pulse-microwave irradiated. The manufacturing status, including curing status, thickness, rheology, and cylinder orientation, is monitored in-situ in real-time by one or more sensors. The monitoring information collected by the one or more sensors can be used to adjust parameters for the next microwave irradiation at a second pulse-microwave radiation location. The cylinders within the slurry are oriented as desired by adjusting the roller pressure, tiling the roller stage, and/or using magnetic field (with adding a fraction of magnetic particles in the cylinder).

DESCRIPTION OF EXEMPLARY EMBODIMENTS

Embodiments of the claimed invention are directed to a deformable, thermal interface material comprised of covalently-bonded polymer carbon nanotube composites, wherein junctions between sponge-like CNT structures are covalently bonded. The high thermal conductivity and low Young's modulus of the composites allows the TIM to easily deform upon various surfaces, thus improving the conduction of heat between surfaces of a heat sink and heat source. In some embodiments, a concentration at the junctions may be manipulated in order to improve the thermal conductivity and mechanical properties of sponges and sponge/polymer composites. Some embodiments further include forming covalent bonds between CNTs with short organic molecules.

Another embodiment of the claimed invention is directed to a method of producing composites with polymers and CNT sponges. The method includes: producing CNT sponges in a 3-zone furnace tube having an inner diameter of 22 mm (without using any substrates); slicing the sponges into a coin shape with thicknesses of 3~6 mm; treating the sponges with ozone plasma for 1 hour wherein the treatment makes the CNT surface more hydrophilic; infiltrating a polyvinylidene difluoride (PVDF) solution into the CNT sponges by soaking them in a PVDF/DMF solution; degassing the sponges in a vacuum (in certain embodiments, ~0.1 Torr) at room temperature for 30 min and drying the sponges at 160° C. for 2 hours.

In another embodiment, the surface of CNT is selectively coated with a polymer using facile microwave irradiation, the polymer coated CNT is stable when in contact with water (unlike silica aerogels) and has a very low thermal conductivity due to the voids formed within the CNT sponge. The polymer coated CNT are also elastic and mechanically very stable compared to silica and other aerogels.

Another embodiment includes pairing TIM with a metal. For example, compared to the above, the polymer can be replaced by a metal. The metal can be a variety of metals including, but not limited to, indium, tin, zinc, and their alloys as well as liquid metals (sponge is a reservoir).

In another embodiment, CNT sponges can be coated by a metal or an elastomer to reinforce mechanical strength. Voids present in the CNT sponges make the material light, while the CNTs make the material strong.

In another embodiment, voids within the CNT sponges can be filled with viscoelastic materials that permit a large amount of energy to be absorbed without the CNT sponge fracturing or having other mechanical failures. This embodiment may be used, for example, to make a lightweight bullet proof vest, impact resistant shield, and the like.

In another embodiment, polymer composites can be made with facile microwave heating without long-term curing processes. CNT, carbon fiber, or other microwave absorbing materials are distributed in the polymer resins. When microwave energy is absorbed, uniform curing due to uniform heating is achieved, avoiding thermal stress after curing.

In another embodiment, polymer composites can be made with hollow cylindrical fibers. The hollow structure allows lightweight composite materials. When the fibers are oriented along a desired direction, mechanical properties can be preserved.

WORKING EXAMPLES

Highly Deformable Sponge-Like CNT Based TIM

Highly deformable sponge-like CNT based TIM was prepared using a scalable method by infiltrating PVDF into three-dimensional (3D) sponge-like CNT bulks. The instant method is different from the typical TIM preparation methods in which fillers are mixed with polymers to make slurry. The instant method crates CNT sponges having branched-network structures with covalently-joined junctions to ensure good thermal transport along the CNT structure as well as maintain a large deformability without fracture.

CNT sponges were bulk-produced in a 3-zone furnace tube having a 22 mm inner diameter, without using substrates. Two different types of CNT sponges were synthesized: a first kind included covalently bonded tubular structures (labeled as c-CNT) and a second kind included spherical C-Fe particles (labeled as p-CNT). The well connected, graphitic, tubular structures in c-CNT are excellent pathways for heat transport. The c-CNT sponges had a density of 40-50 mgl/cm$^3$. The p-CNT sponges had a density of 80-100 mg/cm$^3$. p-CNT sponges were made to have comparative studies for investigating the influence of disengaged particles on thermal conductivity, which mimics a case of typical commercial TIMs containing spherical particles in a polymer matrix. The disengaged particles often suffer from large thermal contact resistance between the conductive additives and polymer matrix.

In a typical 30-minute synthesis to obtain c-CNT sponges with diameters of ~22 mm and lengths of ~100 mm, ~0.3-g ferrocene (Sigma-Aldrich, 98%) was placed in the first upstream zone (120° C.) to deliver iron as a CNT catalyst to the last zone (650° C.) where CNTs grew under the flow of hydrogen (260 sccm, Airgas, 99.999%) and ethylene (80 sccm, Airgas, 99.999%) gases together with argon (80 sccm, Airgas, 99.999%) gas passed through a water bubbler. Note that ferrocene decomposes into iron and other compounds at the reaction zone. A lower reaction temperature (600° C.) was used to obtain p-CNT sponges.

SEM images of an as-synthesized CNT sponge showed that long CNTs were joined rather than heavily intertwined. The CNTs in the c-CNT sponge have a diameter of 200-400 nm and lengths of 30-50 μm, which is slightly different from the CNT in the p-CNT sponge, whose CNT diameter is smaller at around 150-300 nm. The morphology difference can be attributed to the different growth temperature (650° C. for the c-CNT sponge and 600° C. for the p-CNT sponge).

The particles in p-CNT are composed of carbon and iron compounds. The graphitic layers shown in TEM imaging confirms multi-wall CNTs and junctions between CNTs. The two c-CNTs are connected to a catalyst particle between respective ends of each of the c-CNTs. Imaging also showed a graphitic layer near an interface of the catalyst and the c-CNT, which suggests that CNTs were covalently bonded. The p-CNT sponges contained amorphous carbon/catalyst (spherical particles) along with CNTs.

To infiltrate a PVDF solution into the CNT sponges, the sponges were sliced into a coin shape with thicknesses of around 3-6 mm and then treated with ozone plasma (UV/Ozone procleaner, Bioforce nanosciences) for 1 hour to make the CNT surface more hydrophilic. The sponge slices were soaked by a solution containing 5-wt % PVDF (99%, Alfa Aesar) in dimethylformamide (DMF) (99%, Alfa Aesar) and then degassed in vacuum (~0.1 Torr) at room temperature for 30 min and dried at 160° C. for 2 hours.

SEM imaging of a c-CNT sponge composite was performed. The SEM imaging showed that the c-CNT sponge composite has fewer aggregated particles compared to composites with p-CNT sponge. SEM imaging also showed that a void vol % of the p-CNT sponge composite was suppressed after a hot-press process at 160° C. and 29 MPa for 60 minutes. Room temperature thermal conductivities of the c-CNT composite (21 wt % CNT) were found to be ~1.65 W/m-K, the p-CNT sponge composite (22 wt % CNT) before the hot press process was found to be ~0.4 W/m-k and the p-CNT sponge composite (22 wt % CNT) after the hot press process was found to be ~0.9 W/m-k.

The samples were cut along the thickness direction with a razor blade and their cross sections were inspected. Composites were made with the CNT sponges using the PVDF infiltration method. SEM images of c-CNT composites, p-CNT composites before and after the hot press process were collected. The SEM imaging revealed that the p-CNT composite had more voids compared to the c-CNT composite. After the hot-press process, the void volume of the p-CNT had decreased. Composites with c-CNT had fewer aggregated particles compared to composites with p-CNT sponge.

An out-of-plane thermal diffusivity of the disc samples (typically ~1-2.5 mm in thickness) was measured by using Flashline 3000 (TA instruments), and then thermal conductivity (k) was calculated using Equation (1) below:

$$k = cpa \qquad \text{Equation (1)}$$

where c, p, and a are specific heat, mass density, and thermal diffusivity, respectively. The specific heat of the composites was estimated by taking linear averages of those for CNT (0.76 J/g-K) and PVDF (1.6 J/g-K).

The thermal conductivity of the c-CNT sponge composite was measured to be ~1.66 W/m-K, which is much higher than ~0.38 W/m-K from the p-CNT composite. It should be noted that the sponge wt % for both samples were similar (21 and 22 wt %). The relatively low thermal conductivity from the p-CNT composite could be partly caused by a relatively large concentration of pores since the particles impede infiltration of PVDF. After the hot-press process of the p-CNT composite, the thermal conductivity was increased to 0.83 W/m-K, but it is still lower than that of the c-CNT composite. Note that all the thermal conductivity values were measured at room temperature.

The thermal conductivity of the sponge portion was further analyzed to identify the effectiveness of covalent bonding in the sponge. The volume fraction of voids ($\Phi_{Void}$) was calculated to extract the thermal conductivity of the sponge using experimentally and theoretically obtained density values using Equation (2) below:

$$\phi_{Void} = 1 - \frac{\rho_{composite(Experimental)}}{\rho_{composite(Theoretical)}} = 1 - \frac{\rho_{composite(Experimental)}}{\rho_{CNT}\gamma_{CNT} + \rho_{PVDF}\gamma_{PVDF}} \quad \text{Equation (2)}$$

where $\gamma$ is the weight fraction of the indexed material. The experimentally obtained density of the composites with c-CNT was 1.29 g/cm³, and those for p-CNT before and after the hot press were respectively 0.46 g/cm³ and 1.09 g/cm³. The theoretical density values were estimated using 2.1 g/cm³ for the density of typical multi-wall CNTs ($\rho_{CNT}$) and 1.78 g/cm³ the density of PVDF ($\rho_{PVDF}$). The void fraction for the composite with c-CNT, was calculated to be 0.3, and those for p-CNT before and after the hot-press process were 0.75 and 0.41, respectively.

Thermal conductivity of a composite can be described using a parallel resistor model of Equation (3) below:

$$k_{composite} = \Phi_{CNT}k_{CNT} + \Phi_{PVDF}k_{PVDF} + \Phi_{void}k_{void} \quad \text{Equation (3)}$$

Where $k_{void} \sim 0$ and $\Phi$ is the volume fraction of the indexed material, which can be described using the weight fraction of CNT sponge and PVDF in Equation 4 as:

$$\phi_{CNT(or\ PVDF)} = \left[\frac{\gamma_{CNT}(\text{or } \gamma_{PVDF})}{\rho_{CNT}}(1-\phi_{Void})\right] \bigg/ \left[\frac{\gamma_{CNT}}{\rho_{CNT}} + \frac{\gamma_{PVDF}}{\rho_{PVDF}}\right] \quad \text{Equation (4)}$$

The thermal conductivity of PVDF is assumed to be 0.25 W/m-K according to literature. Then the thermal conductivity of the c-CNT sponge was calculated to be 12 W/m-K, which is higher than 6.9 and 6.3 W/m-K from the p-CNT composites before and after the hot-press process, respectively. These values are much higher than ~0.2 W/m-K from CNT films (along the out-of-plane direction) where CNTs were presumably connected by only van der Waals bonding. The spherical particles in p-CNT are estimated to occupy a half of its mass from the density difference between those of the c-CNT sponge prior to PVDF infiltration (40~50 mg/cm³) and p-CNT sponge (80-100 mg/cm³). This suggests that covalently bonded CNTs are the key to improve thermal conductivity.

Thermal conductive enhancement was calculated using Equation (5) below:

$$(k_{Composite} - k_{PVDF})/k_{PVDF} \quad \text{Equation (5)}$$

The enhancement of composite with a c-CNT sponge concentration of 21 wt % was 560%. For comparison, thermal conductivities of CNT/polymer composites are listed in Table 1.

TABLE 1

Thermal conductivity (k) and thermal conductivity enhancement (TCE) of CNT/polymer composites at room temperature

| CNT configuration | k(W/m-K) | TCE | Polymer matrix | CNT filler |
|---|---|---|---|---|
| c-CNT sponge | 1.66 | 560% | PVDF | 21 wt % |
| Randomly dispersed CNT | 0.50 | 200% | PANI | 80 wt. % |
| | 0.39 | 30% | PEDOT:PSS | 60 wt % |
| | 0.90 | 350% | Epoxy | 9 vol % |
| | 0.48 | 200% | Epoxy | 7 wt % |
| | 0.52 | 190% | Epoxy | 7 vol % |
| | 0.40 | 55% | PMMA | 7 wt % |
| | 0.30 | 50% | PS | 1 wt % |
| | 0.25 | 4% | Epoxy | 0.5 wt % |
| Aligned CNT | 4.80 | 1800% | Epoxy | 17 vol % |
| | 1.21 | 280% | Silicone | 3 wt % |
| | 1.40 | 460% | Epoxy | Unknown |

Abbreviation: Poly(3,4-ethylenedioxythiophene)-poly(styrenesulfonate) (PEDOT:PSS); Polyaniline (PANI); Poly(methyl methacrylate)(PMMA); Polystyrene (PS).

Despite the high thermal conductivity up to ~10 W/m-K of an individual CNT, the thermal conductivity of composites with randomly dispersed CNTs in polymers is typically smaller than 1 W/m-K, even with CNT concentrations up to 80 wt %. The low macroscopic thermal conductivity of the CNT-polymer composites can be attributed to thermal contact resistance at CNT-CNT junctions. On the other hand, composites made of aligned CNTs have higher thermal conductivity values, which confirms that thermal transport through fewer CNT-CNT junctions is much more effective than that of polymer composites containing randomly dispersed CNTs. However, the high mechanical strength of aligned CNTs along the axial direction hinders accommodating the surface asperity, limiting the improvement of thermal contact resistance at the interface between TIMs and heat sources/sinks. It is well known that CNTs have strong mechanical properties with a high Young's modulus of 1 TPa, which is extremely hard to deform along the axial direction. Thus, using the c-CNT sponge, thermal conductivities of at least 1 W/m-K are possible.

Figure 1:
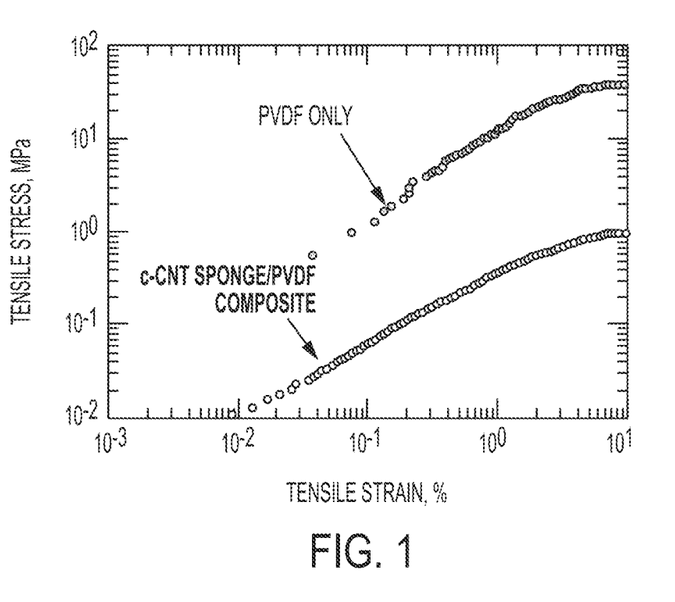
FIG. 1 shows the mechanical properties of the c-CNT composite and PVDF using a dynamic mechanical analysis instrument.

Mechanical properties of the c-CNT composite and PVDF only were measured using a dynamic mechanical analysis instrument (Mettler Toledo TT-DMA). See FIG. 1. Stress-strain curves for a c-CNT composite and PVDF only were plotted. The composite was found to have a Young's modulus of ~50 MPa, which is much lower than the Young's modulus of ~1.5 GPa for PVDF only. Previously reported CNT-filled composites with various polymers such as polyepoxy have Young's moduli of: 3.7 GPa for polyepoxy only; 4.2 GPa for polyepoxy/CNT composite with 0.15 wt % CNT), 2.3 GPa for polycarbonate only; 4.1 GPa for polycarbonate/CNT composite with 8 wt % CNT, and 1.2 GPa for polyvinyl alcohol only; 2.4 GPa for polyvinyl alcohol/CNT composite with 0.2 wt % CNT).

Figure 2:
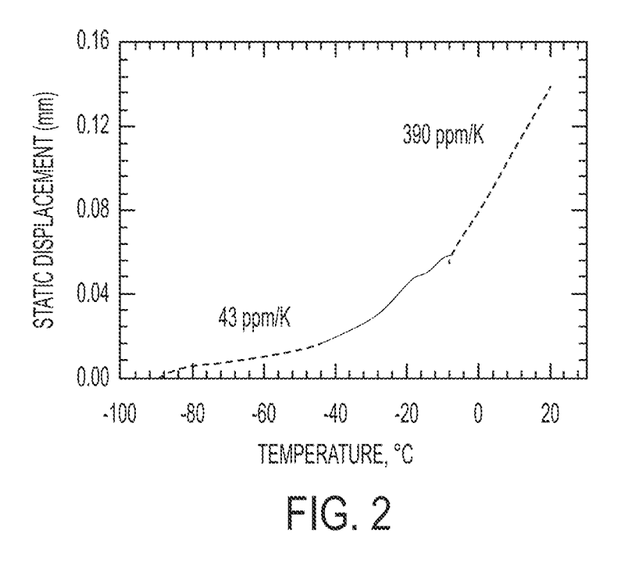
FIG. 2 shows the thermal expansion coefficient of the c-VNT composite.

When CNTs are added, polymer Young's modulus values typically increase. At high strain, the c-CNT composite showed two orders of magnitude lower stress values (FIG. 1) compared to the PVDF only sample. This suggests that the c-CNT composite is capable of large deformability, which is essential to accommodating high surface asperity. In general, a low Young's modulus and large deformability indicate poor heat conduction since phonon transport through weak bonding is retarded. Here, c-CNT composites include flexible porous sponge structures whose junctions are covalently bonded, thus maintaining high thermal conductivity, even with the small modulus and the large deformability. Additionally, the c-CNT composite showed a low thermal expansion coefficient. Static displacement of a composite made of a c-CNT sponge and PVDF as a function temperature and thermal expansion coefficients were calculated to be 43 ppm/K and 390 ppm/K at low and high temperature ranges, respectively. This implies that thermal expansion is small which is good for TIM applications. (See FIG. 2)

Carbon Nanotube Sponge Synthesis

Carbon nanotubes (CNTs) sponge were synthesized by a chemical vapor deposition (CVD) method reported by us previously. An alumina crucible boat containing ~0.3 g ferrocene (Sigma-Aldrich, 98%) was located in zone 1 (upstream) of a quartz tube with an inner diameter of 22 mm. Before the growth, argon (Airgas, 99.999%) gas was flowed for 10 minutes as a purge gas. During the growth reaction, hydrogen (Airgas, 99.999%), ethylene (Airgas, 99.999%), and argon gases were flowed into the tube at flow rates of 260 sccm, 80 sccm, and 80 sccm, respectively. The argon gas was passed through a bubbler filled with deionized (DI) water. The temperatures of zone 1, zone 2, and zone 3 (CNTs growth zone) were 120° C., 120° C., and 650° C., respectively. The typical growth time was 30 minutes to obtain an approximately 80~90 mm long sponge. After the growth reaction, the furnace (Lindberg Blue M. Thermo Scientific) was naturally cooled under 100 sccm argon flow to room temperature.

Carbon Nanotube Sponge-PDMS Composite Fabrication

Figure 4A:
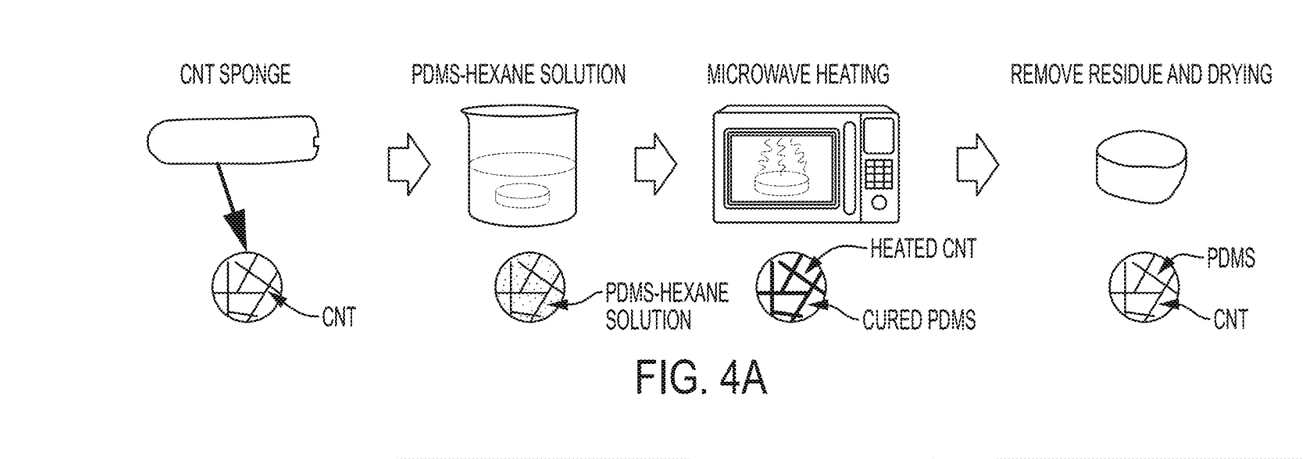
FIG. 4A shows a schematic drawing of the synthesis steps for making a CNT-PDMS composite aerogel.

A schematic of the fabrication steps is set forth in FIG. 4A. In a typical process, fabrication of CNT-PDMS nanocomposite included cutting CNT sponge was into discs having a diameter of approximately 12.7 and a length of approximately 2~3 mm. The discs were then soaked in polydimethylsiloxane (PDMS) (Sylgard 184, Dow Corning)—hexane (60% n-Hexane, VWR) mixture solution and stirred via a magnetic stirrer (Isotemp Hotplate Stirrer. Fisher Scientific) for 3 hours at 300 rpm. To compare the influence of PDMS content, different weight ratios of PDMS-hexane mixture solution were used. After immersion of the CNT sponge discs in PDMS-hexane solution, a microwave heating process was conducted in a microwave oven (EM925AJW-P1, WestBend) with an output power of 900 W. The process was carried out 5 times at approximately 3 seconds using a 50% power setting to make a thin PDMS layer on a surface of the CNT sponge discs. After the microwave heating, nanocomposite was sonicated for 1 minute in hexane to remove unsolidified PDMS residue. The nanocomposite was then dried in a convection oven (Series FP, Binder Inc.) for 30 minutes at 150° C.

Characterization

The scanning electron microscope (SEM) images of the samples were obtained using a FEI Quanta 600 and transmission electron microscope (TEM) images were collected using a JEOL JEM 2010 and a FEI TECNAI G2 F20 FE-TEM. Fourier transform infrared spectra (FT-IR) of the samples were obtained using a Shimadzu IR Prestige attenuated total reflectance Fourier transform infrared (ATR-FTIR) spectrometer in range 3200-650 cm$^{-1}$. Raman spectroscope analysis was conducted by a Horiba Jobin-Yvon LabRam Raman confocal microscope with a 10× objective and 632.8 nm excitation wavelength at room temperature. Laser power was set to 1.91 mW in order to avoid heat-induced damage to the sample. The pore size distribution of sample was estimated from analysis of SEM images using ImageJ 1.45s software.

Mechanical Properties Characterization

Compression tests were conducted using a home-made mechanical properties measurement system with a 50-lb load cell (AL-101NH, AnyLoad) and two flat surface stages (top and bottom). Cylindrical CNT and nanocomposite samples with diameters of one half inch were used for testing. The stress-strain curves (a-s curves) were measured at a strain rate of 40 mm/min and a 3% prestrain to make a uniform flat contact between compression stage and sample. The 10,000-cycle fatigue compressibility test was conducted by measuring stress (a) versus 60% strain (e) at strain rate of 400 mm/min with a 3% prestrain.

Electrical Properties and Thermal Conductivity Measurement

Compressibility-dependent electrical properties of nanocomposite were measured using a two-probe method. Aluminum foil was attached as electrical wire leads to flat surfaces of the sample with silver paste, and the sample was loaded on the instrument with a 3% prestrain. A B&K digital multimeter was used to measure the resistance of nanocomposite as a function of strain. Thermal conductivity was measured by a Thermal diffusivity system (FlashLine-3000, TA Instruments).

Fabrication and Structural Features of Nanocomposites

CNT sponges were synthesized using the CVD method reported by the inventors previously. The synthesized carbon nanotubes have sponge-like porous structures with arbitrarily oriented and entangled CNTs. The CNT sponges replicated a cylinder shape of a quartz tube. Length of the CNT sponges were controlled by reaction time. A ~30 minutes reaction time produced cylindrical sponges with a length of approximately 80~90 mm. Scanning electron microscope (SEM) images of pristine CNT sponges displayed porous CNT structures. The density of the CNT sponges was approximately 25.5 mg/cm$^3$ and the porosity was >98.6%.

Figure 4B:
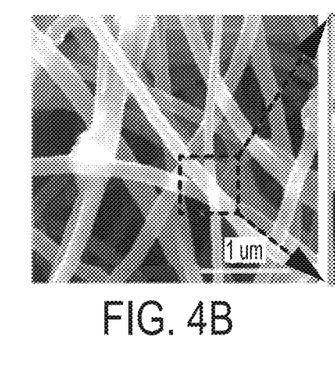
FIG. 4B and FIG. 4C show SEM images of a 0.5 vol % PDMS nanocomposite sponge structure.
Figure 4C:
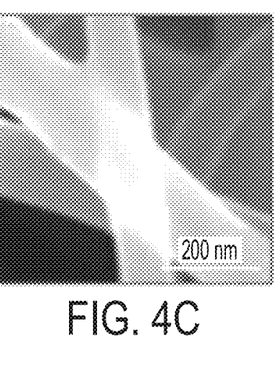

CNT-PDMS sponge nanocomposites were fabricated using microwave heating. Carbon materials are excellent absorbents of microwave radiation. As a result, they generate heat easily. Due to this special characteristic of carbon materials, CNTs were expected to generate enough heat under microwave irradiation for the formation of a polymer layer on the CNTs. The microwave heating process was designed for fabrication of CNT-PDMS nanocomposites. Before the fabrication of sponge-type nanocomposites, a confirmatory experiment of the formation of CNTs-polymer composite by microwave irradiation was conducted. Scanning electron microscopy (SEM) images were collected of PDMS coated CNTs after microwave irradiation for 5 seconds (FIG. 4B and FIG. 4C). PDMS was coated on walls of the CNTs along a length of the CNTs. This phenomenon can be described by a rapid increasing temperature of CNTs, which caused the solidification of PDMS onto the CNTs. Therefore, the SEM images showed clear evidence that the CNTs generated a lot of heat under the microwave radiation in a very short time as the CNTs were excellent absorbers of the microwave radiation.

Figure 4D:
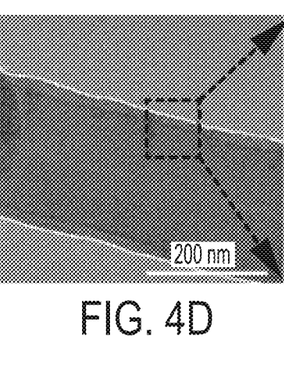
FIG. 4D and FIG. 4E TEM show images of a 0.5 vol % PDMS composite aerogel structure, showing the structure of a nanocomposite having a very thin PDMS layer on the graphitic wall of carbon nanotubes.
Figure 4E:
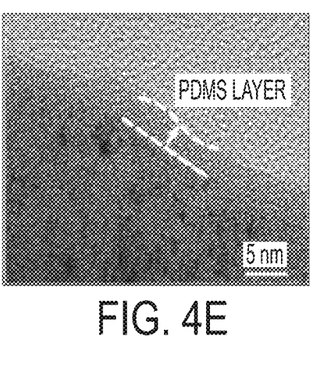

Based on the confirmatory experiment, a simple process for fabricating nanocomposite aerogel was designed. CNT sponges were soaked in a PDMS-hexane mixture solution in order to make a very thin, uniform PDMS layer on walls of the CNTs. Hexane was used as a solvent because hexane is a high-solubility solvent for PDMS. The nanocomposite was exposed to microwave radiation for approximately 3 seconds. Exposure to microwave radiation was then repeated 5 times, making a very thin PDMS layer. The PDMS layer was on the order of nanometer-thickness. The cured PDMS region formed around the CNTs as a result of the dissipation of heat from CNTs to PDMS. Although thermal conductivity of CNTs is higher than that of PDMS (the reported values of CNTs are 200~3000 W/m-K, which is much higher than that of PDMS, 0.13~0.2 W/m-K), heat dissipation happens by conduction and radiation from CNTs to PDMS. In addition, the temperature did not increase the decomposition temperature of the polymer because the thermal resistance between CNTs and PDMS results in a lower heating rate. Thus, nanometer-sized PDMS layers on CNTs were formed via the microwave radiation. SEM images of the CNTs-PDMS composite structure and transmission electron microscope (TEM) images (FIGS. 4D and 4E) showed that walls of the CNTs were composed of multiple graphitic layers and a ~3-nm-thick PDMS layer was formed on the surface of CNTs. In addition, formation of junctions between neighboring CNTs might come from PDMS coatings. PDMS coatings can form a strong bond between neighboring CNTs and the bonding stability between neighboring CNTs may affect the compression stability of the CNT-PDMS composite. The density of the CNT-PDMS composite was found to be 29.4 mg/cm$^3$ and the porosity was >98.2%. Since the fabrication process is a relatively simple and fast process compared to other type of aerogel fabrication processes, scaling up the fabrication of nanocomposite aerogel will be possible.

Characterization of Nanocomposite Sponge Structure

We further characterized the nanocomposite structure using FT-IR and Raman spectroscopy. In the FTIR spectrum of PDMS, an asymmetric peak appears at 2961 cm$^{-1}$, which is due to CH$_3$ stretching in CH$_3$. The CH$_3$ deformation vibration peaks were observed in the range between 1400 and 1420 cm$^{-1}$ and between 1200 and 1300 cm$^{-1}$. The Si—O—Si stretching multicomponent peaks appear in the range between 1000 and 1100 cm$^{-1}$ and CH3 rocking peaks in Si—CH$_3$ are observed at 750~800 cm$^{-1}$ and 850~900 cm$^{-1}$, respectively. Compared with PDMS, the peak shape of the CNTs-PDMS composite in the range between 850 and 1100 cm$^{-1}$ is changed due to the formation of a Si—C bond formed by interaction between CNTs and PDMS.

Raman spectroscopy was also conducted to analyze the nanocomposite structure. The intensity ratio (ID/IG) of D-band to G-band in the Raman spectra for CNTs and the CNTs-PDMS composite showed that the CNTs had an intensity ratio of 1.01, respectively, demonstrating a relatively low crystallinity because of the defects on the CNTs walls. It is possible to consider this structure is good for the fabrication of the CNTs-PDMS nanocomposites because defects on CNTs surface can promote the interaction between CNTs and polymer. The Raman spectra for the CNTs-PDMS nanocomposite also show the characteristic peaks of carbon nanotubes at 1333 and 1589 cm$^{-1}$, respectively. It is possible to see the up-shift of G-band, 1589 cm$^{-1}$, which shows in CNTs at 1583 cm$^{-1}$. This up-shift is associated with exerting a compression force on carbon nanotubes by the polymer layer, changing the tangential motion of carbon nanotubes. It indicates that there is an interfacial interaction between PDMS and CNTs. Therefore, according to the Raman and FTIR spectra for nanocomposite, a polymer layer was formed on the surface of CNTs by microwave radiation. This feature can also be observed in TEM images.

Mechanical Properties of Nanocomposite Sponge

The pristine CNT sponge has a large compressive stress reduction under compression force. To improve the elasticity, CNT-PDMS nanocomposite aerogel structures were designed that had a thin polymer layer on CNTs surface. Our hypothesis is that the CNT-polymer aerogel structure has outstanding mechanical properties and allows for a large deformation without fracture because hybridization with polymers is a typical method for the mechanical improvement of aerogel. The strong connection between neighboring CNTs should assure the reversible elastic behavior without plastic deformation under compression. The nanocomposite sponge can stand a compressive strain ($\varepsilon$) as high as 60% and recover its original shape after the release of the strass ($\sigma$).

Figure 5A:
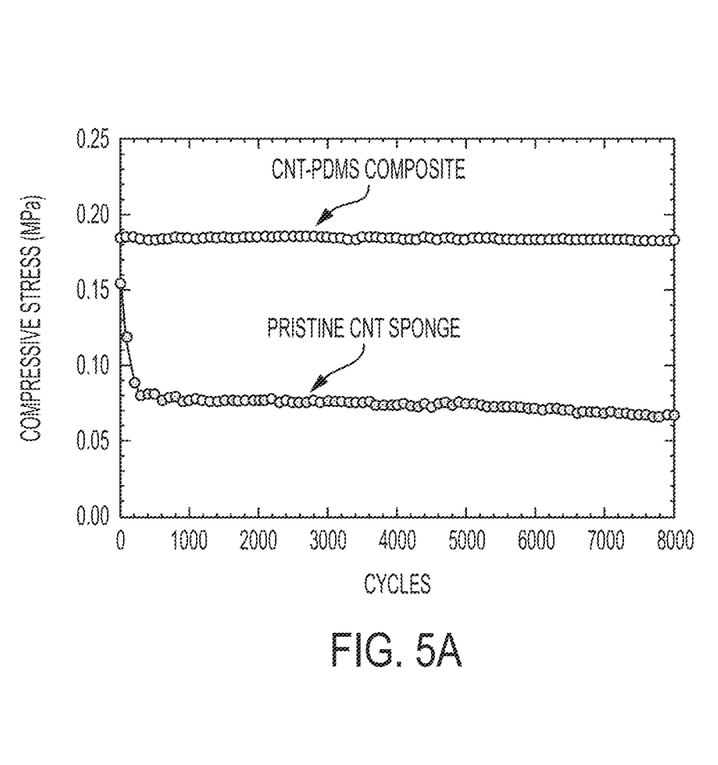
FIG. 5A shows the maximum compressive stress of CNT-PDMS composite aerogel and pristine CNT sponge for 8,000 cycles at 60% strain.

A compressive stress-strain curve for 0.5 vol % PDMS nanocomposite at 60% as the maximum strain was generated (FIG. 5A). A compressive strength 0.184 MPa at 60% compressive strain was observed, which is much larger than other aerogel materials. The nanocomposite can be compressed to more than 60% volume reduction because of high porosity and structural flexibility. Compared to a pristine CNT sponge that showed plastic deformation under compressive stress, the CNT-PDMS composite aerogel showed excellent structural stability, with almost complete recovery from large compressive strain (60%) due to the strong junction between neighboring CNTs via the PDMS coating. The CNT-PDMS composite aerogel recovers to its original height after the release of the stress without measurable change in diameter.

Figure 5B:
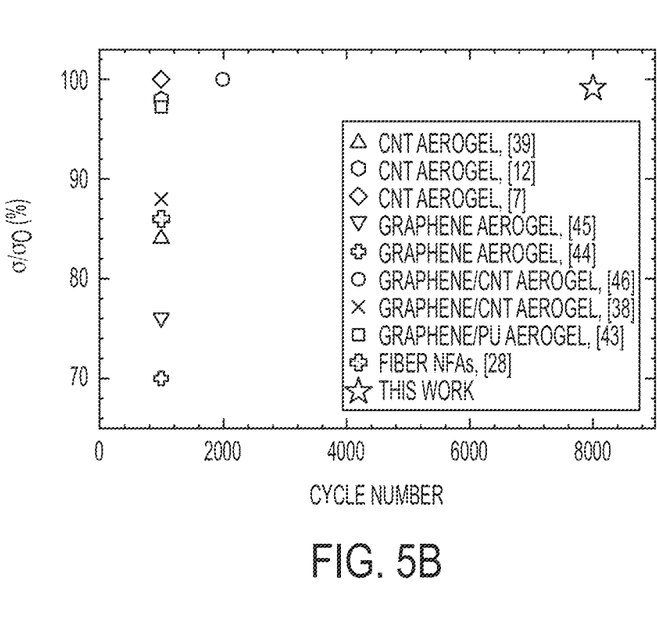
FIG. 5B shows the comparison of the compressive mechanical stability of CNT-PDMS composite aerogel and other materials.

The nanocomposite was also subjected to a cyclic fatigue compressibility test with 8,000 fatigue cycles at $\varepsilon$ of 60%. The nanocomposite showed no significant decrease in maximum stress (1% at 8,000th), which is much lower than a pristine CNT sponge (43% at 200th). In comparison, other carbon based aerogels show a degradation in compressive strength of 10~30% at similar strains (FIG. 5B).

Thermal Insulation and Electric Properties of Nanocomposite Sponge

Figure 6A:
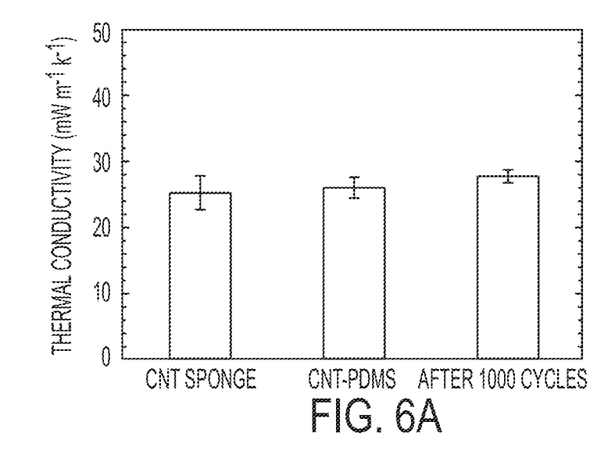
FIG. 6A the thermal conductivity values of pristine CNT sponge, CNT-PDMS composite aerogel, and after 1,000 cyclic compressive test with 60% strain.
Figure 6B:
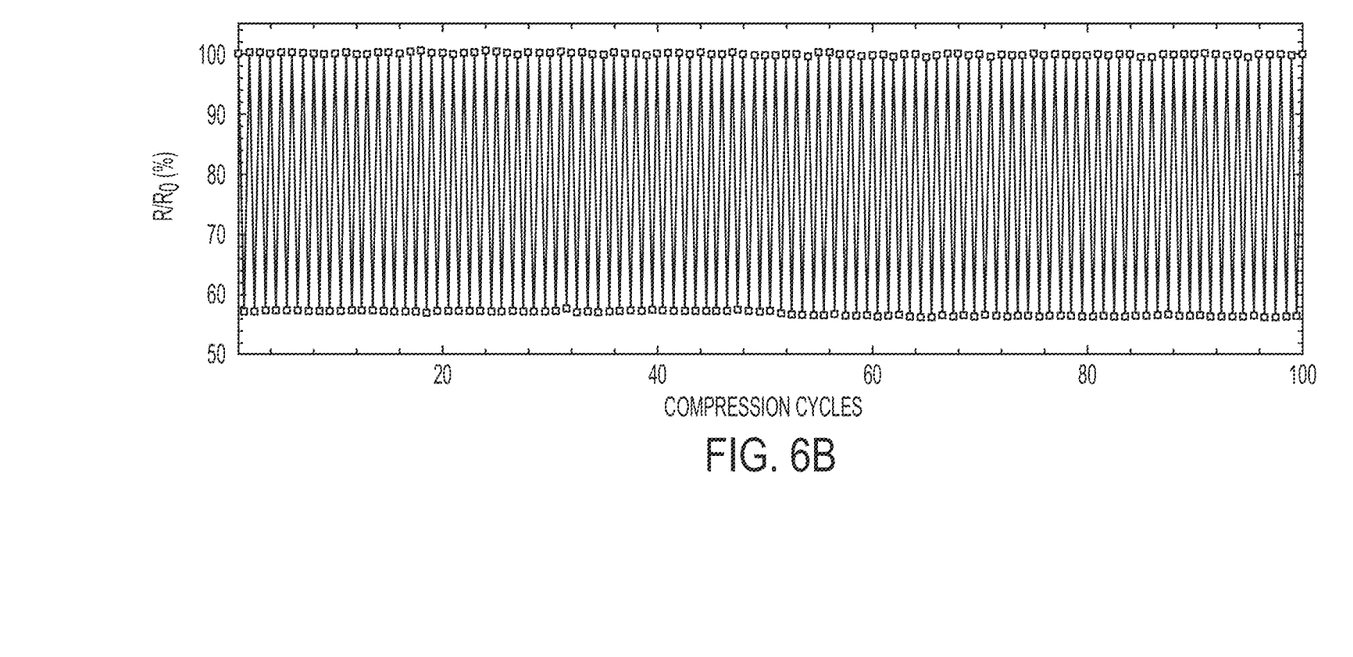
FIG. 6B shows the ratio of initial resistance of the CNT-PDMS composite aerogel to a resistance after cycling (R/R0) when repeatedly compressed ($\varepsilon$=50%) for 100 cycles.

Typical aerogels are thermal insulation materials with extremely low thermal conductivity due to high porosity. A 0.5 vol % PDMS nanocomposite aerogel with a density of 29.4 mg/cm$^3$ showed an outstanding thermal conductivity of 26 mW/m-K, which is similar to that of pristine CNT sponges that have a density of 25.6 mg/cm$^3$ and that of air at ambient condition (23 mW/m-K) (FIG. 6A). In addition, thermal conductivity values of CNT-PDMS composite aerogel changed little after 1,000 cycles, indicating that a nanometer-size polymer layer on the CNTs enhanced the mechanical strength and compressibility without affecting the increase in thermal conductivity (FIG. 6B). The thermal conductivity was increased when the density of the CNT-PDMS composite aerogel was increased due to the decrease of the porosity. According to the result, our nanocomposite aerogel shows ultra-low thermal conductivity with high mechanical strength and resilience, suggesting its use as a promising thermal insulation material with high mechanical properties in a broad range of applications.

The thermal conductivity value of the nanocomposite aerogel is related to the thermal properties of the components and the structure of nanocomposite aerogel. The average diameter of the nanocomposite pores was estimated from analysis of SEM cross-section images using ImageJ 1.45s software. The gas contribution to thermal conductivity can be estimated according to:

$$\kappa\_g = (\kappa\_{(g\_0)} \Pi)/(1+2\beta K\_n) \qquad \text{Equation (6)}$$

where $\Pi$ is the porosity, kg$_0$ is the thermal conductivity of gas, $\beta \approx 2$ for the parameter of energy transfer between gas molecules and solid structure 48. The Knudsen number, $K_n$, is:

$$K_n = l_g/\delta \qquad \text{Equation (7)}$$

where $l_g$ is the mean free path of a gas molecule and $\delta$ describes the pore diameter. We estimated the gas conductivity with nanocomposite aerogel that the gas thermal conductivity kg remains below the value of $k_g0$.

The nano-sized solid components also have an interfacial thermal resistance, as known as the Kapitza resistance, which leads to decrease the thermal conductivity of solid components. The effective solid conductivity, $\kappa^*_{sol}$, of individual solid components of nanocomposite aerogel uses:

$$\kappa^*_{sol} = \kappa_{sol}(1 + \kappa_{sol} R_K/d) \quad \text{Equation (8)}$$

where d is the diameter of CNT and PDMS layer, and $\kappa_{sol}$ is the thermal conductivity of individual components. The $R_K$ values of components of nanocomposite aerogel were taken from literatures. We calculated the thermal conductivity of solid components using Equation (8), suggesting that nanocomposite structure can reduce $\kappa^*_{sol}$ from ~1,200 mW/m-K for bulk material with same composition as nanocomposite aerogel to below 10 mW/m-K for the nanocomposite aerogel since phonon scattering.

Electrical resistance of the CNT-PDMS composite aerogel as a function of compressive strain was plotted, which showed an initial electrical conductivity of 20 S/m without strain. The relative electrical resistance ($R/R_0$) decreased by approximately 55% with an increase in strain to 60% and recovered like the initial electrical resistance during the unloading. The compressive stress made plenty of new electrical contacts, added to the existing conduction paths through the nanocomposite aerogel, and decreased the electrical resistance. When the compressive stress was removed, the new electrical contacts disappeared, the nanocomposite sponge recovered to the initial electrical resistance and sprang back to its original shape. In addition, the relative electrical resistance ($R/R_0$) of CNT-PDMS composite aerogel was also relatively constant over 500 cycles. Therefore, these results support the use of CNT-PDMS composite aerogel as a pressure sensor and a flexible electrode for various applications.

In conclusion, it has been shown that the facile and quick process for the scalable production of super resilient with multifunctionality CNTs-PDMS sponge nanocomposite using microwave heating. The microwave heating process leads to a quick reaction and allows for the uniform polymer layer on CNTs. The nanometer-thickness PDMS layer coated CNTs sponge shows high mechanical strength (0.184 MPa), compressibility, thermal insulation (26 mW/m-K) and elasticity-dependent electric conduction. Although further studies are needed to optimize the processing to adjust this process for many applications, we believe that super resilient with multifunctionality CNT-PDMS sponge nanocomposites may be used for many applications, such as heat insulator, pressure sensor, dampers, and flexible electrodes.

Microwave-Assisted Rapid and Scalable Manufacturing of Lightweight Polymer Composites with Controlled Mechanical Properties The proposed technology is a method that saves energy and allows the manufacture of lightweight polymer composites with controllable multi-functionality by selective microwave heating of CNT or carbon fiber (CF) for curing (to minimize heat loss/emission) as well as hollow cylindrical fillers during roll-to-roll process to have lightweight composites with desired mechanical properties.

Key shortcomings of the current state-of-the-art in manufacturing of polymer composites is that long-term curing/cooling processes in ovens are typically required. Low thermal conductivity through a thickness of the polymer composites results in a large amount of wasted heat emission to the environment. In order to assure that the polymer composite cures uniformly, the polymer composite must be heated from the outside at a slow rate to assure that cure reaction is uniform at a safe, slow rate throughout the structure. The slow process is even more important for lightweight porous composites due to low and non-uniform thermal conductivity. Even after the part is fully cured, energy and time are required to slowly cool the material uniformly throughout the structure to avoid high residual stress.

These shortcomings are overcome by microwave processing that creates rapid and uniform heat through the entire material. A microwave is very effective in selectively heating CNT or CF due to their very rapid and intensive responses under microwave. Microwave irradiation intensively heats only CNT/CF rather than whole polymers, thus the heating time can be decreased to seconds. Reducing the heating time to seconds reduces the energy required by orders of magnitude. With multiple pulsed microwave irradiation and real-time monitoring sensors in the proposed roll-to-roll system, microwave conditions (e.g., duration, intensity) are controlled to limit the volume heated at any given time to reduce the chance of uncontrolled exotherm, shorten heating and manufacturing time, and reduce residual stress.

A key innovation comes from selective heating by microwave irradiation. Microwave irradiation interacts with charged particles (e.g., multi-wall carbon CNT, CF) and causes ultra-fast intensive heating. When the particles are mixed with non-polar or weak-polar liquid-phase polymers, the particles are selectively heated by microwave. When the absorbed microwave energy is released as heat, composites can be cured without significant heat loss to the environment. The curing status can be monitored in real-time, and microwave irradiation can be repeated until the composites are fully cured. This selective heating also minimizes residual stresses caused by uneven temperature distribution that occurs in typical bulk composites during heating and cooling processes, which necessitate slow manufacturing processes.

The target applications are lightweight composites with controlled mechanical properties by adding hollow cylindrical fillers (made of high-temperature polymers) to the mixture of liquid-phase polymers and CNT during the curing process. The hollow cylinders can reduce the weight of the composite without sacrificing mechanical properties. Depending on the configuration and concentration of the cylinders, the mechanical property can be controlled as desired. For example, when the composite contains aligned hollow cylinders, compressive strength along the axial direction can be greatly increased. Altering concentration of the cylinders allows for functionally graded composites or impact-resistant composites with alternating soft and rigid structures to be manufactured.

Figure 3:
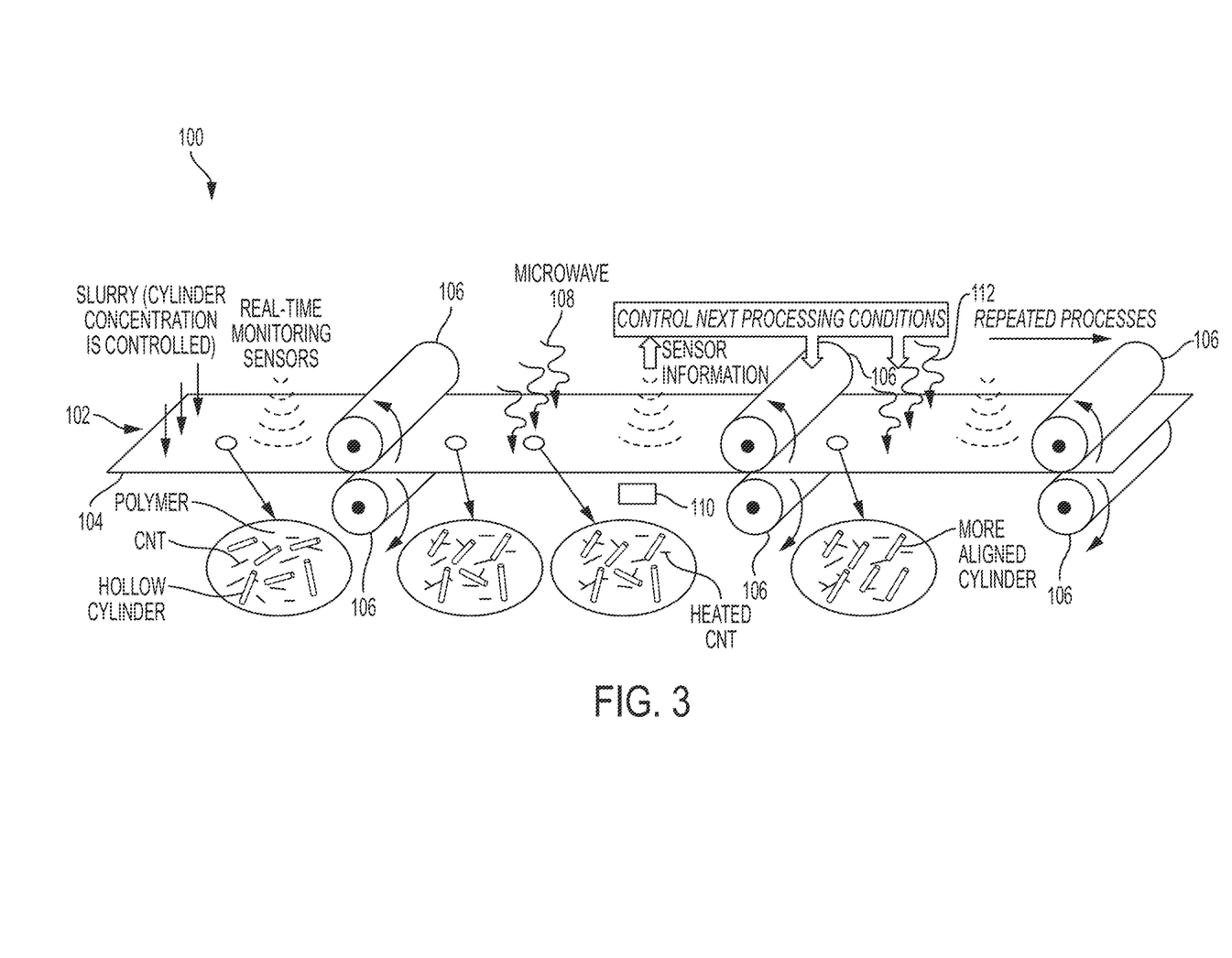
FIG. 3 is a schematic illustration of a continuous roll-to-roll manufacturing process with in-situ real-time monitoring.

The above process provides a relatively easy, microwave-assisted, scalable roll-to-roll manufacturing method. A process 100 is now described in more detail relative to FIG. 3. CNT-containing liquid-phase polymers (slurry) with desired concentration/size of hollow cylinders is dispensed at loading area 102 of a conveyor 104. The slurry is then conveyed by one or more rollers 106 to a pulse-microwave location 108 where the slurry is pulse-microwave irradiated. The manufacturing status, including curing status, thickness, rheology, and cylinder orientation, is monitored in-situ in real-time by one or more sensors 110. The monitoring information collected by the one or more sensors 110 can be used to adjust parameters for the next microwave irradiation at a second pulse-microwave location 112. The cylinders within the slurry are oriented as desired by adjusting the roller pressure, tiling the roller stage, and/or using magnetic field (with adding a fraction of magnetic particles in the cylinder). The cylinders will be fabricated from high-temperature polymers such as polyetheretherketone (PEEK) using extrusion. The proposed manufacturing process has a wide applicability as long as the microwave-absorbing activity of polymers is not as high as that of CNT or equivalents).

Key Technical Risks/Issues

Key technical risks/issues include dispersing CNT in liquid-phase polymers uniformly, finding optimum CNT concentration and microwave time to uniformly heat and cure polymer composites, and controlling the fabrication conditions in real-time during the roll-to-roll process. These risks/issues are mitigated by iterative computation and experiments.

Microwave irradiation can effectively cure polymers. Soft PDMS was cured near CNT with multiple microwave (3-sec each) irradiation. The thickness of the cured layer can be controlled by the viscosity and irradiation time and power. Note that this work is designed to make porous structures but both porous and non-porous composites can be made using similar methods.

The potential impact on composite fabrication would be immediate and energy savings would leverage the mass/strength benefits of composites to make them affordable for new, energy efficient transportation structures. The reduce vehicle mass (lightweight) would allow vehicles to have smaller, less powerful drives (electric, fuel cell, or internal combustion) and smaller, lower mass energy storage (batteries, gas, or liquid fuel) while maintaining high performance acceleration and long range between renewing the onboard energy store.

While the present invention has been described in terms of certain preferred embodiments, it will be understood, of course, that the invention is not limited thereto since modifications may be made to those skilled in the art, particularly in light of the foregoing teachings.

What is claimed is:

1. A method of making carbon nanotube (CNT)-polymer composite, the method comprising:
    producing CNT sponges in a tube furnace;
    slicing the produced CNT sponges into a shape with desired dimensions;
    treating the sliced CNT sponges with ozone plasma to make the sliced CNT sponges more hydrophilic;
    soaking the treated CNT sponges in a polymer solution to infiltrate the treated CNT sponges with the polymer solution;
    soaking the treated CNT sponges in a mixture comprising a polymer and a solvent to dissolve the polymer and form a polymer layer on walls of CNTs in the CNT sponges;
    exposing the soaked CNT sponges to multiple microwave radiation treatments with cooling steps between each treatment; and
    forming a CNT-polymer composite.

2. The method of claim 1, wherein the producing the CNT sponges comprises producing CNTs having covalently bonded tubular structures.

3. The method of claim 2, wherein the tube furnace comprises three zones and the producing comprises:
    using ferrocene in a first zone to deliver iron as a CNT catalyst to a third zone; and
    flowing hydrogen gas, ethylene gas, and argon gas through the tube furnace.

4. The method of claim 1, further comprising:
    degassing the soaked CNT sponges in a vacuum.

5. The method of claim 4, further comprising:
    drying the degassed CNT sponges.

6. The method of claim 1, wherein the polymer solution comprises polyvinylidene fluoride in dimethylformamide.

7. The method of claim 1, wherein the exposing forms bonds between the CNTs due to the polymer layer on the walls of the CNTs.

8. The method of claim 1, wherein the polymer is polydimethylsiloxane and the solvent is hexane.

9. The method of claim 8, wherein the polymer layer is a polydimethylsiloxane layer.

10. The method of claim 8, wherein the CNT-polymer composite is a CNT-polydimethylsiloxane (CNT-PDMS) composite.

11. The method of claim 1, wherein concentration of the polymer can be changed or multiple deposition processes can be carried out to fill voids created in the CNT-polymer composite up to 100%.

12. A method of making a carbon nanotube (CNT)-polymer composite, the method comprising:
    placing a slurry comprising CNTs and liquid-phase polymers on a conveyor;
    conveying the slurry to a first pulse-microwave radiation location and irradiating the slurry;
    monitoring in situ the irradiated slurry with at least one sensor; and
    conveying the slurry to a second pulse-microwave radiation location and irradiating the slurry.

13. The method of claim 12, wherein the irradiating at the second pulse-microwave radiation location comprises adjusting one or more irradiating parameters based upon the monitoring.

14. The method of claim 12, wherein the monitoring comprises at least one of a manufacturing status, a curing status of the slurry, a thickness of the slurry, a rheology of the slurry, and cylinder orientation of the CNTs.

15. The method of claim 12, further comprising adjusting an orientation of the CNTs by adjusting at least one of a roller pressure of a roller, tiling a roller stage, and a magnetic field.

16. The method of claim 12, wherein hollow fillers are added to make lightweight composites.

17. The method of claim 12, wherein hollow fillers are oriented along a desired direction to achieve desired mechanical properties along a particular orientation.

* * * * *